United States Patent [19]

Konstantinov et al.

[11] Patent Number: 4,499,173
[45] Date of Patent: Feb. 12, 1985

[54] PHOTOGRAPHIC MATERIAL FOR USE IN PHOTOLITHOGRAPHY

[75] Inventors: Ivan T. Konstantinov; Borislav D. Mednikarov; Maria A. Sahatchieva; Atanas T. Burov, all of Sofia, Bulgaria

[73] Assignee: Zlafop pri Ban, Sofia, Bulgaria

[21] Appl. No.: 491,814

[22] Filed: Jul. 5, 1983

Related U.S. Application Data

[63] Continuation-in-part of Ser. No. 240,988, Mar. 5, 1981, abandoned.

[51] Int. Cl.$^3$ .................. G03C 1/50; G03C 1/72; G03C 1/94; G03F 7/02
[52] U.S. Cl. .................. 430/278; 430/270; 430/271; 430/275; 430/302; 430/495
[58] Field of Search ............ 430/270, 302, 495, 271, 430/278, 346, 275

[56] References Cited

U.S. PATENT DOCUMENTS

| | | | |
|---|---|---|---|
| 3,707,372 | 12/1972 | Hallman et al. | 430/348 |
| 3,762,325 | 10/1973 | Hallman et al. | 430/348 |
| 3,996,057 | 12/1976 | Kawaziri et al. | 430/353 |
| 4,115,127 | 9/1978 | Ikeda et al. | 430/302 |
| 4,198,237 | 4/1980 | Nahara et al. | 430/495 |
| 4,276,368 | 6/1981 | Heller et al. | 430/270 |

Primary Examiner—Richard L. Schilling
Attorney, Agent, or Firm—Murray, Whisenhunt & Ferguson

[57] ABSTRACT

Photolithographic materials for use in the production for example of microelectronic circuits and sensitizing and printing elements in offset printing plates show marked improvement in sensitivity, non-critical outline developement and good shelf life as well as high resolving power while remaining sensitive to exposure from a wide variety of radiation sources if comprising a carrier base and on the carrier base a thin homogeneous or emulsion layer of at least one photosensitive substance which is capable upon exposure to radiation of yielding a latent positive image and exhibiting photoselective capacity for dissolution in alkaline developer according to such image, the photosensitive substance being either unreactive with the carrier base on exposure to radiation or reactive with the carrier base and isolated from the carrier base by interposition of an intermediate layer which does not react with the photosensitive substance when the latter is exposed to radiation. The photographic material contains, at least when being developed, one or more materials selected from dyestuffs having the capacity for dyeing tannined cotton, dyestuffs having the capacity for dyeing synthetic fibres, compounds capable of acting as accelerators, antioxidants or age resistors in the vulcanization of elastomers and developing agents effective in the development of silver halide-based photographic materials.

18 Claims, 7 Drawing Figures

PHOTOGRAPHIC MATERIAL FOR USE IN PHOTOLITHOGRAPHY

This is a continuation-in-part application of parent application Ser. No. 240,988, filed Mar. 5, 1981, now abandoned.

This invention relates to a photographic material for use in photolithography, for example in the production of microelectronic circuits and the production of sensitizing and printing elements in offset printing plates.

It is known that some inorganic photosensitive substances, such as arsenous sulphide undergo changes in some of their physical and chemical properties after exposure to radiation of various types. If only partial or imagewise exposure to radiation of such substances takes place, it has been found that the change in chemical properties on irradiation includes an increase in the rate of dissolution in certain solvents in those areas of the photosensitive substance which have been irradiated as compared to the non-irradiated areas. The solvents generally employed are alkaline solutions. These inorganic photosensitive substances are nevertheless stable to some chemical reagents, for example acids, thereby enabling acid to be employed to etch out metal exposed on dissolution of exposed photosensitive substance leaving a metal image corresponding to the subject originally photographed on removal of the residual, undissolved photosensitive layer. Such a procedure for use of the photographic material of the aforementioned type in the production of photoresist materials, for example for use in the production of microelectronic printed circuits is described by Nogai. H, Yoshikawa. A, Toyoshima. Y, Ochi. O and Mizushima. Y in Applied Physics Letters 28, 145 (1976) and in Applied Physics Letters 29, 677 (1976). The capacity for inking of the materials resulting from dissolution of imagewise exposed photosensitive material renders them suitable, in principle, for use in the production of offset printing formes (U.S. Pat. No. 3,762,325). Notwithstanding the advantages given in the first two aforementioned references of such a photographic system for use in the production of photoresist material, as compared to the previously widely used photolacquers, namely exceptionally high resolution, the possibility of depositing the photosensitive layer on a substrate by evaporation in a vacuum, thereby achieving excellent uniformity and impurity-free preparation conditions, very good adhesion, thereby allowing the more intricate processes of etching of the substrate or an intermediate layer to be carried out successfully, nevertheless such photographic materials have not hitherto found practical application. The main reason for this is the low ratio between the rates of dissolution of imagewise exposed and unexposed photosensitive substance in the presence of the usual alkaline solutions employed for such purpose. This ratio may be termed photoselectivity of dissolution. This ratio increases on increasing the extent of exposure, but even when exposure is at the maximum practical, the alkaline development procedure does not provide sufficient photoselectivity of dissolution. Moreover, the photographic material is generally insufficiently sensitive to the comparatively high exposure required to achieve the maximum photoselectivity of dissolution.

Hence the following two disadvantages of the aforementioned type of photographic system may be identified:

1. Low sensitivity in comparison to organic photolacquers hitherto used.
2. Very poor tolerance during the duration of the alkaline development, i.e. development to the critical extent is difficult to achieve.

The critical character of the alkaline development results from the low photoselectivity of dissolution which results, on complete removal of exposed inorganic photosensitive substance, in unexposed areas being affected to some extent depending upon the amount of exposure and on the activity of the alkaline developer as a solvent for the photosensitive substance, the pH of the developer being of particular importance here. Because of the way in which the two aforementioned disadvantages are inter-related, there has not hitherto been described any photographic system which simultaneously solves both problems.

Experiments carried out by the inventors have revealed two further disadvantages in such photographic systems. The first is the appearance of pinholes in the photosensitive layer after alkaline development and treatment with an acid etching solution, for example an acid ceric ion-containing solution for chromium. The second disadvantage is the increase in the number and size of these pinholes which takes place when these photographic materials undergo storage over a period of time before processing. This ageing process makes the photographic materials unusable as photoresists after a certain storage time, or even immediately after their production when particularly high standards are placed on the photoresists, as for example in the production of microelectronic printed circuits. Bearing in mind the characteristic advantages of a photographic system of the aforementioned type, it will therefore be appreciated how the overcoming of the aforementioned disadvantages would yield a product capable of wide application in photolithographic processes.

It is an object of this invention to produce a photographic material of the aforementioned type, which shows good photoselectivity of dissolution after exposure to radiation.

According to the present invention, there is provided a photographic material for use in photolithography, which material is capable of yielding, or imagewise exposure to radiation, a latent positive image, which material comprises a carrier base and, on the carrier base, a thin homogeneous or emulsion layer of at least one photosensitive substance selected from chalcogenides of phosphorus, arsenic, germanium and metals, which photosensitive substance is capable, upon exposure to radiation, of exhibiting photoselective capacity for dissolution in an alkaline developer, the photosensitive substance being either unreactive with the carrier base when exposed to radiation or reactive with the carrier base when exposed to radiation and isolated from the carrier base by interposition between the said layer and the carrier base of an intermediate layer having adhesive and/or insulating and/or hydrophilic properties and which does not react with the photosensitive substance when the latter is exposed to radiation, the photographic material additionally containing at least one organic compound selected from dyestuffs having the capacity for dyeing tanned cotton, dyestuffs having the capacity for dyeing synthetic fibres, compounds capable of acting as accelerators, antioxidants or age resistors in the vulcanization of elastomers and developing agents effective in the development of silver halide-based photographic materials.

The carrier base of a photographic material, either embodying the invention can be of any one of a wide variety of materials, for example plastics, paper, cardboard, glass, ceramic material or metal. The size, shape and contours of the surface of the carrier base to which the photosensitive material is to be applied can be selected in accordance with the intended use of the photographic material to be produced. In some cases, it may be necessary for there to be between the carrier base and the photosensitive material, an intermediate layer which does not react with the photosensitive substance when the latter is exposed to radiation and which is formed, for example, of rubber, lacquer, plastics, metal, for example chromium or aluminium, dielectric material used in the production of thin films for optical purposes etc., or a combination of several such layers applied in turn. Depending on the properties thereof, the intermediate layer or layers serve to improve the adhesion of the photosensitive layer to the carrier base and/or the isolation of the photosensitive layer from the carrier base when the latter might otherwise react with the photosensitive substance undergoing exposure and/or to render the carrier base hydrophilic as for example when it is to be used in the production of offset printing plates. The provision of metal intermediate layers will be of particular value when preparing photoresist materials.

The photosensitive layer comprises an inorganic photosensitive substance which, after exposure to radiation, undergoes photoselective dissolution on treatment with an alkaline developer. Such inorganic photosensitive substances may be deposited pure or doped with halogen and will be sulphides, selenides and tellurides of one or more elements selected from phosphorus, arsenic, germanium and certain metals, usually being metals belonging to groups Ib, IIb, IIIa, IVa and Va of the Periodic Table of the elements, being especially antimony (III), cadmium and bismuth, as in for example antimonous, cadmium and bismuth sulphides. Another preferred material is phosphorous sulphide. The photosensitive materials are preferably amorphous substances, for example arsenous sulphides and mixtures of a number of the aforementioned elements, in particular arsenic, sulphur, germanium and selenium. From the foregoing, it will be appreciated that the photosensitive substances are not necessarily simple compounds but may contain the respective elements in other than an exact stoichiometric ratio.

The development of the photographic material in discrete areas to obtain a latent positive image is carried out using an alkaline developer; that is an aqueous alkaline solution. For this purpose it is possible to employ, for example, salts of strong bases and weak acids, for example lithium, sodium, potassium and ammonium carbonates, phosphates, sulphides, polyphosphates or borates, hydroxide solutions, for example alkaline metal hydroxides and aqueous ammonia, solutions of organic compounds which undergo alkaline reaction, for example aliphatic amines, diamines, polyamies, and quaternary phosphonium oxides.

Both the inorganic photosensitive substance and the alkaline developing agent may contain mixtures of substances as aforementioned.

The organic compounds employed according to the present invention in the photographic material itself or in the developing agent for use therewith in order to improve the properties and photographic characteristics of the photographic material after processing may be selected from three fundamental classes of materials.

Thus, it is possible to employ an organic dyestuff which may be a dyestuff suitable for use in the dying of tannined cotton. Examples of dyestuffs which may be used for this purpose and in the aforementioned photographic materials are xanthine, acridine, azine, oxazine, thiazine, diphenylmethane, triphenylmethane, cyanine and basic azodyes. It is also possible to employ dyestuffs suitable for use in the dying of synthetic fibres, especially polyacrylonitrile and acrylic fibres in general. Dyestuffs of such type are the commercially available dyes known as Basacryls, Sandocryls, Astrazons, Deorlins, Maxilons, Setacycles depending upon the manufacturer thereof.

A second group of organic compounds which may be employed are those used in the vulcanization of elastomers as accelerators, antioxidants or age resistors. Examples of these compounds are the following:

1. dithiocarbamates and derivatives thereof having e.g. the general formula:

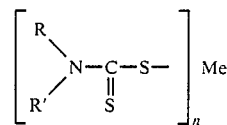

wherein R, and R' are hydrocarbyl radicals, especially alkyl or aryl, Me denotes a metal or amino group and n denotes the valency of the metal or amino group;

2. thiuramsulphides and derivatives thereof having e.g. the general formula:

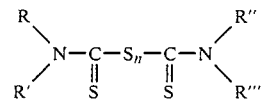

wherein R, R', R" and R''' are hydrocarbyl radicals, especially alkyl or aryl and n denotes an integer from 1 to 4;

3. thiazoles and derivatives thereof having e.g. the general formula:

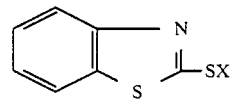

wherein X denotes hydrogen, a metal atom or an organic radical;

4. sulphonamides and derivatives thereof having e.g. the general formula

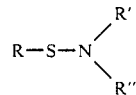

wherein R denotes a thiazolyl or benzthiazolyl radical, or a residue of a carbamic acid or a heterocyclic compound and R' and R" denote hydrocarbyl radicals, especially alkyl or aryl radicals;

5. guanidines having e.g. the general formula

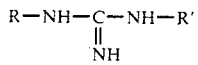

wherein R and R' denote hydrocarbyl radicals especially aryl radicals;

6. aldamines having e.g. the general formula:

wherein R denotes a hydrocarbyl group, especially an alkyl or aryl radical and R'—CH= denotes the residue of an aldehyde; and 7. a heterocyclic five-membered ring-containing compound in which the ring contains from 1 to 4 heteroatoms and sulphonated derivatives and sulphydryl (mercapto) derivatives thereof.

The antiageing action is also achieved with those organic compounds effective in the development of silver halide-based photographic materials, for example methol, hydroquinone, amidol, para-aminophenol and para-phenylenediamine.

In producing the aforementioned photographic materials, the photosensitive layer is generally deposited in a thickness of from 0.01–10 μm on the carrier base by any of the methods known for this purpose, for example, evaporation or sputtering in a vacuum of the inorganic photosensitive substance or substances.

It is possible to carry out the simultaneous evaporation of one or more pre-prepared compounds and/or of the individual elements thereof which combine on the substrate. As an alternative to employing such a method, it is also possible to deposit the photosensitive layer by centrifugation of a powder compaction or by spreading thereover a solution or suspension of one or more inorganic photosensitive substances in a suitable liquid medium, for example water, followed subsequently by drying of the liquid film. A colloidal solution utilized for the last identified purpose can additionally contain a high molecular compound, for example gelatin, polyvinylalcohol or polyvinylpyrrolidone, which after drying of the coated liquid layer forms a photographic emulsion.

The organic compounds used according to the present invention may be introduced into the whole or part of the volume of the photosensitive layer in an overall concentration of from 0.1 to 20% by weight. Alternatively, the photosensitive compound may be applied in several stages separated by the application to the then applied photosensitive layer of the organic compounds. The organic compounds may also be applied to the surface of the photosensitive layer. Organic compounds applied in such manner as discrete layers thereof may be applied in monomolecular coatings in an amount of up to $10^{-2}$ g/cm$^2$. As an alternative to incorporating the organic compounds in the photographic material, especially when they are dyestuffs as aforementioned, they can be utilized in addition to or as an alternative to use in the photographic material in the alkaline developing agent in concentrations of from $10^{-2}$ g/l up to the maximum quantity soluble at the working temperature of the developer. When the organic dyestuff is applied as a surface layer on the photosensitive material, such application may take place before or after exposure of the photographic material. The other aforementioned organic compounds utilized according to the present invention will generally be provided in the photographic material only during preparation of the photosensitive layer. It will therefore be appreciated that different organic compounds as aforesaid may be incorporated in the photographic material either simultaneously or through the aforementioned variants in the doping, use of intermediate films or use of surface films on the photosensitive layer contemplated in the foregoing.

The introduction of the organic compound or combinations thereof in the whole or part of the volume of the finished photosensitive layer can be achieved by evaporation thereof in vacuum and condensation of vapours thereof together with the vapours of the inorganic photosensitive substance. Such organic compounds can also be deposited at a time when deposition of the inorganic photosensitive substance is not taking place as one or more intermediate films at different depths in the photosensitive layer and/or on its surface. Deposition of the organic compounds on the surface of the photosensitive layer or as an intermediate film can also be achieved by dipping the then produced photographic material in a solution of the relevant organic compound for from 10–300 seconds or by applying the organic compound to the surface of the photographic material from a solution thereof by centrifugation, powdering, or by spreading or coating of a solution of the organic compound and subsequently drying the photographic material.

When the organic compound is coated onto the photographic material in the form of a solution or suspension, the organic compound may be added to the solution or suspension prior to application thereof to the carrier base.

The aforementioned dyestuffs, in particular, may be applied to the photographic material from the alkaline developing agent only at the time of developing the latent positive image produced on the photographic material. The organic dyestuffs may be added directly to the alkaline developing agent or in the form of a solution in a solvent, for example water, or an organic solvent, for example an alcohol, ketone, ester or mixtures thereof miscible with the alkaline developing agent. The type and quantity of the solvent present in the alkaline developing agent influences strongly the efficiency of the dyestuffs. This influence is also observable when the dyestuffs are incorporated into the photosensitive layer. Thus, the addition of alcohols, ketones or esters, or mixtures thereof, to the alkaline developing agent may also be effected when working with water soluble dyestuffs or when they have been introduced previously into the photosensitive layer in order to influence the efficiency of the dyestuffs.

In preparing a photographic system embodying this invention, whether an organic compound according to this invention is incorporated in the photographic material or in the alkaline developing agent, the preparation and optimization of the photographic system from the point of view of quality and photographic characteristics will depend on the type of substrate used, the composition of the photosensitive layer and the manner of its preparation, the nature and quantity of the organic compound or compounds added, the pH of the alkaline developer, the type and quantity of the organic solvent incorporated therein and the type and concentration of the alkaline substance present in the developing agent.

A photographic system embodying this invention has been found to possess the following characteristic advantages:

1. High photographic sensitivity which is from 10 to 20 times higher than the sensitivity of hitherto described photographic materials for use in photolithography comprising photosensitive organic substances; the photographic sensitivity is of the order of the sensitivity of the organic photolacquers hitherto widely used in photolithographic practice;

2. Non-critical alkaline development permitting variations by from 20-25%, in some cases up to 50%, in development time without leading to inadmissible changes of detail on the image produced on the photographic material, thus enabling accurate reproduction of a subject over the whole area of the photographic material;

3. A shelf life more than six months after the preparation of the photographic material.

In addition to these advantages, the photographic materials possess the characteristic advantages of the inorganic photosensitive systems of the type referred to herein, compared to the organic photolacquers hitherto widely used in photolithographic practice:

4. Exceptionally high resolving power; the possibility of achieving deposition of the photosensitive layer by evaporation or sputtring in a vacuum, thereby achieving excellent uniformity and enabling preparation to be carried out under very clean conditions and in which entry of impurities into the product is substantially avoided;

5. Very good adhesion to the carrier base allowing the etching of the substrate or of an intermediate layer to be carried out safely; multilayer materials containing photosensitive and other inorganic substances may be employed; easy removal of the photosensitive layer, both in respect of exposed and unexposed areas;

6. Sensitivity to exposure with a wide variety of radiation sources including, as well as actinic light, electron beams.

Reference will now be made, by way of example to the accompanying drawings, in which.

Figure 1:
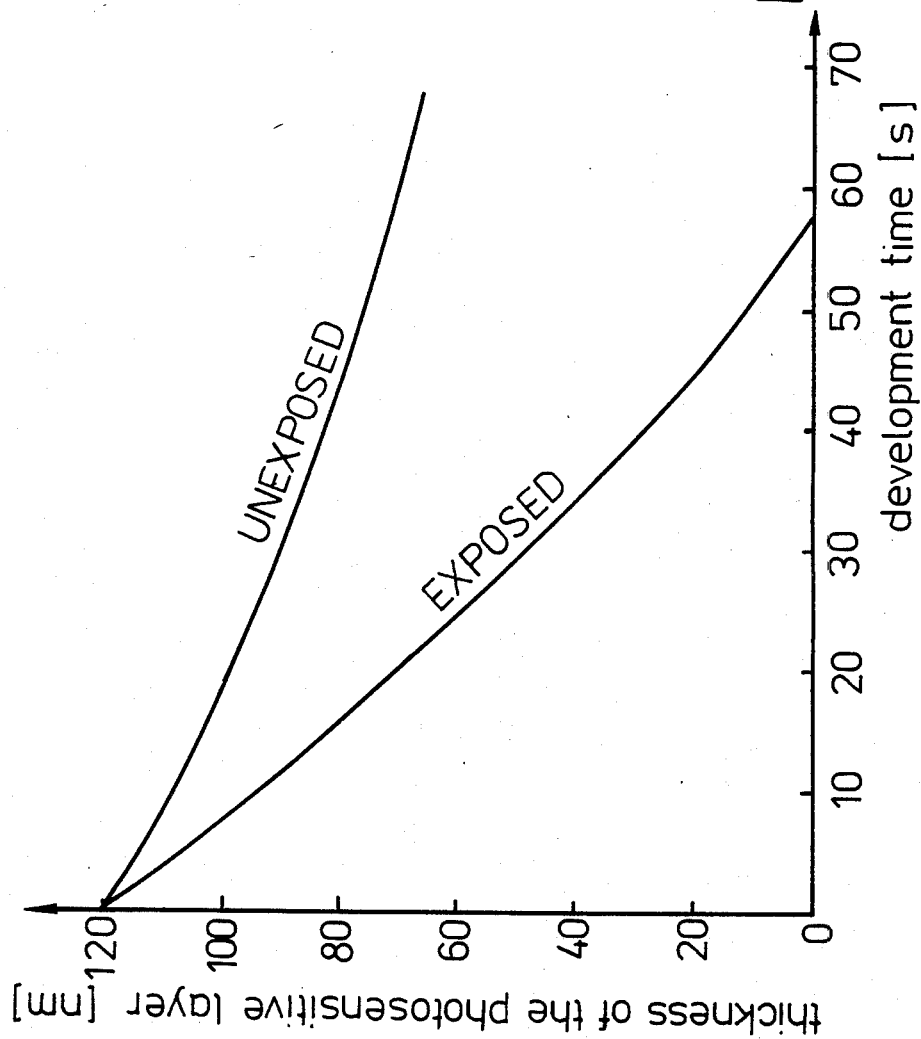
FIG. 1 shows curves of the solubility of exposed and unexposed arsenous sulphide photosensitive layers (see Example 15 and Comparative Examples A and Table 4, No. 1). This figure illustrates the state of art prior to the present invention.
Figure 2:
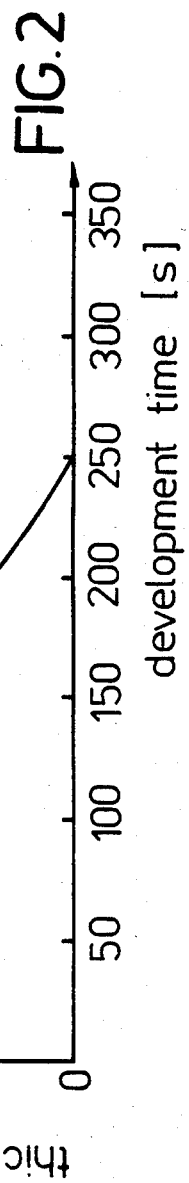
FIG. 2 shows curves of the solubility of exposed and unexposed photosensitive layers of arsenous sulphide (see Example 15 and Comparative Example A and Table 4, No. 3). This figure illustrates some of the advantages of the present invention (much higher photoselectivity and as a consequence higher sensitivity and non-critical development).

FIGS. 3 to 7 illustrate the structure of a photographic material undergoing processing to obtain in turn chromium photomasks, a positive image 7 in the photosensitive layer 1 and a chromium pattern 6 utilising the acid resistance of the unexposed photosensitive layer 5 of the photographic material.

Figure 3:
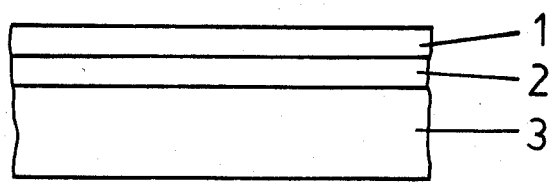
Figure 4:
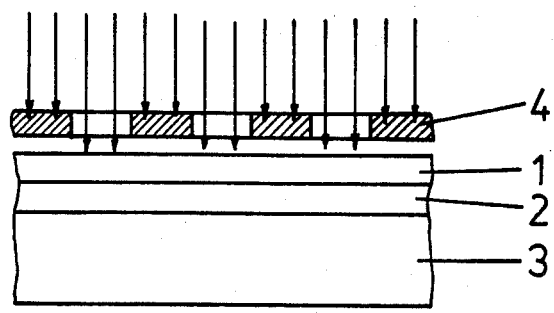

More specifically FIGS. 3 to 7, in which the numerals 1 to 7 denote the following: 1—photosensitive layer; 2—chromium intermediate layer; 3—carrier base; 4—emulsion photomask; 5—unexposed photosensitive layer; 6—chromium pattern; 7—positive image, show the following:

FIG. 3: A schematic cross-sectional view of a photographic material according to the present invention for use in obtaining a chromium photomask;

FIG. 4: A view similar to that of FIG. 3 but illustrating the selective and discrete exposure of the photographic material to incident white light through an emulsion photomask 4.

Figure 5:
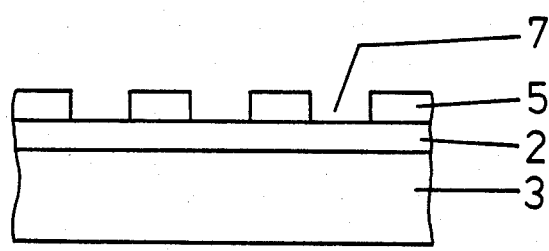

FIG. 5: A view similar to that of FIG. 4 but showing the photographic material after removal of the exposed photosensitive layer in alkaline developer to obtain a positive image 7 in the photosensitive layer 1.

Figure 6:
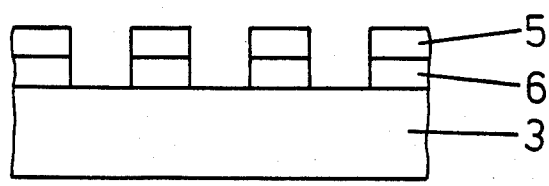

FIG. 6: A view similar to that of FIG. 5 but showing the photographic material after etching of a chromium intermediate layer 2 in order to obtain a chromium pattern 6.

Figure 7:
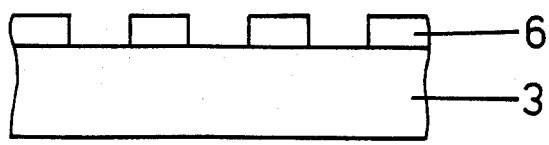

FIG. 7: A view similar to that of FIG. 6 but showing the photographic material after removal of the unexposed photosensitive layer 5 in alkaline solution, i.e. the final chromium mask.

The following Examples illustrate this invention:

EXAMPLE 1

Polished and washed glass substrates were subjected to ion bombardment. An arsenous sulphide photosensitive layer 0.5 $\mu$m thick was deposited on such a glass substrate in a single vacuum cycle under a vacuum better than $10^{-5}$ Torr at a condensation rate of 10 A/sec. In this vacuum cycle, after depositing the first 0.1 $\mu$m of photosensitive layer, without interrupting the evaporation of the arsenous sulphide, simultaneous evaporation of mercaptobenzimidazole was commenced to achieve simultaneous deposition thereof to dope the next 0.4 $\mu$m of photosensitive layer with 1.2% by weight of mercaptobenzimidazole. Deposition of arsenous sulphide and mercaptobenzimidazole was then stopped and, using the same vacuum conditions, erythrosine (C.I.45430—Acid Red 51) was deposited on the surface of the photosensitive layer in an amount of $5 \times 10^{-4}$ g/cm$^2$.

The photographic material thus obtained was exposed to light having a sinusoidal intensity distribution and obtained by the interference of two laser beams.

The exposed photographic material was then developed for 3-4 minutes in aqueous alkaline solution having a pH of 11.5 and containing 50 g/l sodium carbonate and 100 g/l sodium phosphate, the solution being acidified with phosphoric acid to the aforementioned pH value. The photographic material was then washed under running deionized water and dried.

The desired profile of the diffraction grating used during exposure was obtained easily and non-critically since the developer had no dissolving action on the photosensitive layer when it reached a depth wherein the light had not caused any changes in the photosensitive material.

A reflective diffraction grating was obtained from the developed plate by vacuum evaporating a thin reflective aluminium layer onto the already suitably profiled surface of the photographic material.

EXAMPLE 2

Oxidized silicon wafers were subjected to ion bombardment. A Ge$_{30}$As$_{10}$S$_{60}$ photosensitive layer 0.1 $\mu$m thick was deposited on such a substrate in a single vacuum cycle under vacuum better than $10^{-5}$ Torr at a condensation rate 2 A/sec. In this vacuum cycle, after depositing the first 0.03 $\mu$m of photosensitive layer, without interrrupting the evaporation of the Ge$_{30}$As$_{10}$S$_{60}$, simultaneous evaporation of 2,2'-dithiobisbenzthiazole was commenced to achieve simultaneous deposition thereof to dope the next 0.07 $\mu$m of the photosensitive layer with 0.8% by weight of 2,2'-dithiobisbenzthiazole. Deposition of Ge$_{30}$As$_{10}$S$_{60}$ and 2,2'-dithiobisbenzthiazole was then stopped and, using the same vacuum conditions, Rhodamine B (C.I.45170 Basic Violet 10) was deposited on the surface of the photosensitive lasyer in an amount of $7\times 10^{-4}$ g/cm$^2$.

The thus obtained photographic material was then exposed to white light through a chromium photomask.

The exposed photographic material was developed for 1-3 minutes in the aqueous alkaline solution described in Example 1, to obtain thereby a positive image in the photosensitive layer. The photographic material was washed under running deionized water and then the silica was etched in a solution of 1 part by volume of a 48% by weight solution of hydrofluoric acid and 10 parts by volume of a 40% by weight solution of ammonium fluoride for several minutes depending on the thickness of the silica layer. The photographic material, with a silica pattern thus obtained therein, was thoroughly washed in deionized water and the undissolved unexposed photosensitive layer was removed by immersion for 5-10 sec. in a 5-10% by weight aqueous solution of sodium hydroxide. Finally the oxidized silicon wafer with the pattern in the silica layer was washed thoroughly in water and dried.

EXAMPLE 3

In this and subsequent examples reference will be made to the procedural steps shown in FIGS. 3 to 7 of the accompanying drawings.

An intermediate layer of chromium 2 having an optical density of more than 2 was deposited under a vacuum better than $10^{-5}$ Torr onto a polished and washed glass substrate 3. Utilizing the same vacuum conditions, a photosensitive layer 1, 0.1 μm thick was deposited on the intermediate chromium layer 2 thus formed by evaporation of arsenous sulphide from a boat or crucible at a condensation rate of 1 A/sec. At the same time as the arsenous sulphide was deposited, telluric diethyl dithiocarbamate was deposited in a concentration of 1.5% in the photosensitive layer as a result of its simultaneous evaporation from a second source.

The photographic material thus produced (FIG. 3) was then exposed to white light through an emulsion photomask 4 (FIG. 4) and dipped for 30 sec. in a saturated aqueous solution of Rhodamine B (C.I.4517-0)—Basic Violet 10). Following washing with deionized water, development of the photosensitive layer 1 was carried out for 3 to 4 minutes in an aqueous alkaline solution having a pH 11.0 and containing 50 g/l sodium carbonate and 50 g/l sodium phosphate acidified with phosphoric acid to the aforementioned pH value. Thus a positive image 7 was obtained in the photosensitive layer 1 (FIG. 5). The photographic material was washed under running deionized water and then immersed for 30 to 60 sec. in a solution made up by adding 100 g ceric ammonium nitrate and 43.2 ml perchloric acid to 1 liter water in order to achieve chromium etching (FIG. 6). After thorough washing in deionized watger, the unexposed photosensitive layer 2 was removed by immersion for 5-10 sec. in a 5-10% by weight aqueous solution of sodium hydroxide (FIG. 7). The chromium pattern 6 then obtained was washed thoroughly in water and dried.

EXAMPLE 4

The procedure of Example 3 was repeated in a series of experiments in which the following features of Example 3 were varied:

(a) The organic compound, telluric diethyl dithiocarbamate used in Example 3 was replaced in turn in a series of experiments by each of organic compounds 2 to 16 identified in Table 1 which follows;

(b) Samples produced using each of organic compounds 1 to 16 of Table 1 were each subjected to the following alternative forms of radiation: monochromatic light and electron beams using both emulsion and chromium photomasks;

(c) The procedures of repeat experiments (a) and (b) and also of Example 3 were repeated so that each of dyestuffs 1 to 16 of Table 2 which follows was used in combination with each organic compound of Table 1 and each of the masks and light sources. In each case the aqueous alkaline solution employed with the respective dye had the pH value give in column 5 of Table 2.

(d) In further repeat experiments, the solution of the dye was applied to the plates by the following methods: powder coating, centrifugation, spreading or coating.

EXAMPLES 5 TO 12

The procedure of the foregoing Examples 3 and 4 was repeated in a series of experiments in which there were used in the respective series of experiments in place of the arsenous sulphide as inorganic photosensitive substance, one of the inorganic photosensitive substances set out in Table 3 which follows applied by evaporation to the carrier base. After exposure, the photographic materials thus produced were immersed for 30 sec. in a saturated solution of the chosen dye. The alkaline developer employed subsequently is identified in Table 3 for each of the various inorganic photosensitive substances. A positive image 7 was obtained in the photosensitive layer 1. A chromium pattern 6 was produced in each case by the procedure described in Example 3.

EXAMPLE 13

The various experiments described in Examples 3 to 12 were repeated but with the difference that, instead of dipping the photographic material in the solution of a dyestuff after exposure, dipping took place in a saturated aqueous solution of the dye for 30 sec. prior to exposure.

After washing and drying, the photographic material (FIG. 3) was exposed and developed in accordance with the type of inorganic photosensitive substance used in a developer solution having a pH corrected to the corresponding value in Table 2 or, when the photosensitive substance was a substance identified in Table 3, having the corresponding composition set out in Table 3. After obtaining a positive image 7 in the photosensitive layer 1, a chromium pattern 6 was produced in each case by the procedure described in Example 3.

TABLE 1

| No. | Organic compound | Structural formula | Doping concentration weight % |
|---|---|---|---|
| 1. | Telluric diethyldithiocarbamate | 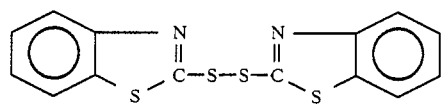 | 1.5 |
| 2. | Tetramethylthiurammonosulphide | 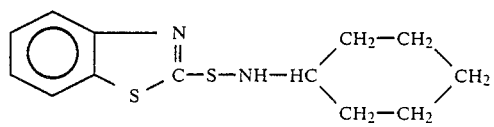 | 0.3 |
| 3. | Altax dibenzothiazoledisulphide | 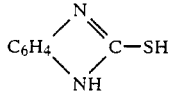 | 0.5 |
| 4. | Vulcacite C | 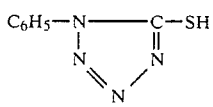 | 0.7 |
| 5. | N,N'—diphenylguanidine | $C_6H_5-NH-\underset{\underset{NH}{\|}}{C}-C_6H_5$ | 1.1 |
| 6. | Accelerant T | | 1.2 |
| 7. | Mercaptobenzimidazole | 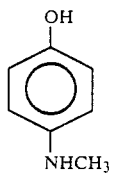 | 1.0 |
| 8. | Phenylmercaptotetrazole | 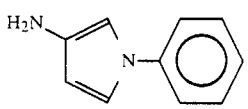 | 1.0 |
| 9. | Methol | | 0.8 |
| 10. | 1-phenyl-4-amino-5-pyrazolone | | 0.9 |
| 11. | Ethyleosin | 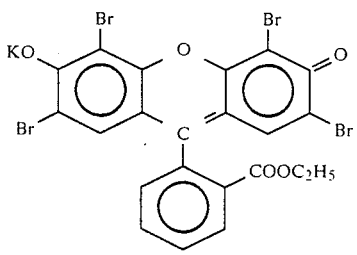 | 1.3 |

TABLE 1-continued

| No. | Organic compound | Structural formula | Doping concentration weight % |
|---|---|---|---|
| 12. | Alkali blue 6B (C.I. 42765 Acid Blue 119) | [structure] | 1.3 |
| 13. | Rosaniline chloride | [structure] | 1.0 |
| 14. | Chrysoidine (C.I. 11270 Basic Orange 2) | [structure] | 0.9 |
| 15. | Luxol brilliant green BL | Reactive dye with unknown structure; believed to be a derivative of the triphenylmethane dyes | 1.2 |
| 16. | p-Ethoxy-chrysoidine | [structure] | 1.0 |

TABLE 2

| No. | Name of dye | Structural formula | C.I.* | pH of the alkaline devel. solution |
|---|---|---|---|---|
| 1. | Rhodamine B (Basic Violet 10) | [structure] | 45170 | 11.0 |
| 2. | Leather yellow HG (Basic Yellow 9) | [structure] | 46040 | 11.0 |

TABLE 2-continued

| No. | Name of dye | Structural formula | C.I.* | pH of the alkaline devel. solution |
|---|---|---|---|---|
| 3. | Neutral red (Basic Red 5) | (phenazine structure with (CH$_3$)$_2$N substituent, N-H$^+$, [Cl$^\ominus$]) | 50040 | 10.5 |
| 4. | Nile blue (Basic Blue 12) | (benzophenoxazine structure with (C$_2$H$_5$)$_2$N, =NH$_2^+$, [Cl$^\ominus$]) | 51185 | 11.5 |
| 5. | Azur A (Basic Blue 5) | ((CH$_3$)$_2$N— phenothiazine —=NH$_2^+$, [Cl$^\ominus$]) | 42140 | 11.0 |
| 6. | Auramine (Basic Yellow 2) | ((CH$_3$)$_2$N—C$_6$H$_4$—C(=NH$_2^+$)—C$_6$H$_4$—N(CH$_3$)$_2$, [Cl$^\ominus$]) | 41000 | 11.0 |
| 7. | Soluble blue 6B (Acid Blue 93) | (triphenylmethane dye with C$_6$H$_4$HN/SO$_3$Na, N.C$_6$H$_4$/SO$_3$Na, NH.C$_6$H$_4$SO$_3$, phenyl) | 42780 | 10.5 |
| 8. | Bismarck brown 6B (Basic Brown 4) | H$_3$N$^+$—C$_6$H$_4$—N=N—C$_6$H$_4$—N=N—C$_6$H$_4$—N$^+$H$_3$, [Cl$^\ominus$] [Cl$^\ominus$] | 21010 | 11.0 |
| 9. | Flavaniline (Basic Dye) | (quinoline structure with CH$_3$, C$_6$H$_4$—NH$_2$) | 47025* | 11.0 |
| 10. | Procion brilliant blue M5BS | (anthraquinone structure with NH$_2$, SO$_3$H, NH—C$_6$H$_4$—NH—triazine(Cl,Cl)) | | 10.5 |
| 11. | Basacryl red XBL (Basic Red 29) | Cationic basic dye of BASF - BRD | S163 | 11.0 |
| 12. | Sandocryl gold yellow BRLE | Cationic dye of Sandoz - Switzerland | | 11.5 |
| 13. | Remacryl orange RRL | Cationic dye of Hoechst, BRD | | 11.0 |
| 14. | Astrazon red RL | Cationic dye of FBy - BRD | | 11.0 |

TABLE 2-continued

| No. | Name of dye | Structural formula | C.I.* | pH of the alkaline devel. solution |
|---|---|---|---|---|
| 15. | Deorlin light blue R1 | Cationic dye of CIBA - Switzerland | | 11.5 |
| 16. | Maxilon blue 5G | Cationic dye of CIBA - Switzerland | | 11.5 |

TABLE 3

| No. | Inorganic photosensitive substance | Composition of the alkaline developer |
|---|---|---|
| 1. | $As_{10}Se_{57.5}Ge_{22.5}$ | 0.33N NaOH |
| 2. | $As_2S_5$ | 50 g/l $Na_2CO_3$ |
| 3. | $As_{30}Se_{52.5}Ge_{17.5}$ | 0.33N NaOH |
| 4. | $As_{40}Se_{15}S_{35}Ge_{10}$ | 0.33N NaOH |
| 5. | $Se_{75}Ge_{25}$ | 25% solution of $(CH_3)_2NH$ |
| 6. | $Se_{55}Te_{20}Ge_{25}$ | 25% solution of $(CH_3)_2NH$ |
| 7. | $Se_{60}Sn_{15}Ge_{25}$ | 25% solution of $(CH_3)_2NH$ |
| 8. | $Ge_{17}As_{26}S_{57}$ | 50 g/l $Na_3PO_4$ corrected with $H_3PO_4$ to pH 11.0 |

*C.I. - Society of Dyers and Colourists, British Colour Index, Rowe F. M. (ed.) 2nd Ed., Bradford, 1956, Suppl. 1963

EXAMPLE 14

An intermediate layer of chromium 2 with an optical density of more than 2 was deposited under vacuum conditions better than $10^{-5}$ Torr onto a polished and washed glass substrate 3. In the same vacuum cycle, an arsenous sulphide photosensitive layer 1, 0.12 um thick, was then deposited at a condensation rate of 1 A/sec. onto the chromium layer 2 whose deposition had been concluded. After depositing the first 0.04 um of photosensitive layer 1 and without interrupting the vapourisation of the arsenous sulphide, simultaneous evaporation of phenylmercaptotetrazole was commenced to achieve simultaneous deposition thereof to dope the next 0.08 um of photosensitive layer with 1% by weight of phenylmercaptotetrazole. Deposition of arsenous sulphide and phenylmercaptotetrazole was then stopped and using the same vacuum conditions, Eosin (C.I.453-80—Acid Red 87) was deposited on the surface of the photosensitive layer in an amount of $3.5 \times 10^{-4}$ g/cm$^2$.

The thus obtained photographic material having the general format shown in FIG. 3 was exposed and developed in the manner described in Example 3 using the developing solution at a pH corrected initially to 12.0. After obtaining the positive image 7 in the photosensitive layer 1, (FIG. 5) the final chromium pattern 6 (FIG. 7) was produced by carrying out the post-development stages of Example 3.

EXAMPLE 15 AND COMPARATIVE EXAMPLE A

The procedure of Example 14 was repeated but with the following differences:

A. In Example 15, Eosin (C.I.45380—Acid Red 87) was not evaporated onto the surface of the photographic material; and B. In Comparative Example A, the photosensitive layer 1 was not doped with phenylmercaptotetrazole and Eosin (C.I.4530—Acid Red 87) was not evaporated on the surface of the photographic material.

Each of the test samples was contact exposed through a chromium mask and subsequently treated in the manner described in Example 3. Comparison data in respect of the products obtained in Comparative Example A, Example 15 and Example 14 are set out in turn in Table 4 which follows. The table indicates the different pH values of developing solutions which were employed. The sensitivity is determined as the reciprocal of the value of the time of exposure at constant intensity of the light source. The data for sensitivity in the sixth column are relative, being based upon the sensitivity of pure arsenous sulphide being equal to 1.

TABLE 4

| No. | Photosensitive layer | pH of the alkaline developer | time of development sec. | Tolerances in development time | Relative Sensitivity | Shelf-life months |
|---|---|---|---|---|---|---|
| 1. | $As_2S_3$ | 10.5 | 60 | ±8 | 1 | ½-1 |
| 2. | $As_2S_3$ doped with phenylmercaptotetrazole | 10.5 | 60 | ±8 | 1 | over 6 |
| 3. | $As_2S_3$ doped with phenylmercaptotetrazole and Eosin on the surface | 12.0 | 330 | ±25 | 20 | over 6 |

EXAMPLE 16

An intermediate layer of chromium 2 with an optical density above 2 was deposited onto a polished and washed glass substrate 3 under a vacuum better than $10^{-5}$ Torr. Using the same vacuum cycle, a 0.1 um thick photosensitive layer 1 was deposited as follows:

Arsenous sulphide was evaporated from a suitable crucible and deposited at a condensation rate of 1 A/sec. Simultaneously, Thiuram D, Mercazine I and hydroquinone previously mixed together in equal quantities and pressed into a pellet were evaporated from another crucible so that the photosensitive layer 1 was doped throughout with these materials in an amount of 0.5% by weight. The photographic material (format of FIG. 3) thus obtained was exposed in the manner described in Example 3 or Example 4 (format of FIG. 4). Development was then carried out for 3 to 4 minutes in an aqueous solution containing 10 g/l sodium hydroxide (acidified with concentrated nitric acid to pH 11.0) and 2 g/l Nile blue (C.I.51185—Basic Blue 12). Thus a positive image 7 (FIG. 5) was obtained in the photosensilayer 1. After thorough washing in water, the chromium 2 was etched (FIG. 6) and the remaining unexposed photosensitive layer 5 was removed in the manner described in Example 3 to give a product having the format of FIG. 7.

EXAMPLE 17

Photographic materials having the format shown in FIG. 3 were produced in the manner described in Example 15. They were then exposed in the manner described in Examples 3 and 4 to achieve the format shown in FIG. 4 and were developed in a developing agent prepared in the following manner:

15 g potassium hydroxide were added to 900 ml water and the pH of the solution was adjusted to 11.0 with concentrated sulphuric acid. 2 g Cryptocyanine were dissolved in 100 ml ethyl alcohol and this alcoholic solution was added to the aqueous developing agent with intensive stirring.

Development was carried out for 3 to 4 minutes to obtain a positive image 7 in the photosensitive layer 1 (format of FIG. 5). After thorough washing in water, the chromium 2 was etched (FIG. 6) and the remaining unexposed photosensitive layer 5 was removed in the manner described in Example 3 to obtain a material having the format shown in FIG. 7.

EXAMPLE 18

A photographic material having the format shown in FIG. 3 was prepared in the manner described in Example 16. It was exposed in the manner described in Example 3 to achieve the format shown in FIG. 4 and then developed for 3 to 4 minutes in a developing agent having the composition given in Example 3, adjusted to pH 11.0 and to which were added 4 g/l Acridine orange (C.I.46005—Basic Orange 14), 0.5 g/l Safranine O (C.I.50240—Basic Red 2), 0.1 g/l Methylene blue (C.I.52015—Basic Blue 9) and 2 g/l Erythrosine (C.I.45430—Acid Red 51). In this way, a positive image 7 was obtained in the photosensitive layer 1 (FIG. 5). The operations described in Example 3 were then carried out until the final chromium pattern 6 was produced (format of FIG. 7).

EXAMPLE 19

A photosensitive layer of arsenous sulphide was vapour deposited under a vacuum better than $10^{-5}$ Torr onto an anodised aluminium offset plate in a thickness of 0.1 um at a rate of deposition of 10 A/sec. The sensitised plate was exposed through a mask on a copying frame and was developed in a solution produced by adding 75 g sodium carbonate, 0.2 g Pyronine Y (C.I. 45005 Basic Dye) to 1 liter water. Development was carried out for about 100 sec. by wiping the plate with a cotton pad soaked with the developing solution in some experiments and by dipping in a bath or a developing unit in other experiments. The plates with the already obtained positive image in the photosensitive layer were then washed under running water and subjected to hydrophilisation by immersion in an aqueous solution of phosphoric acid in a concentration of 50 ml/l. After a second washing in water, inking and gumming with gum arabic, the plates were ready for printing.

COMPARATIVE EXAMPLE B

The procedure of Example 19 was repeated with plates being produced in the manner described in Example 19 and developed in the same alkaline developing agent but for the omission of the pyronine Y (C.I.450-05—Basic Dye) therefrom. At equal sensitivities, this absence of the dye from the developing agent led to a higher critical response in respect of the time of development (10-15 sec.) as compared with the developing time when Pyronine Y (C.I.45005—Basic Dye) was present in the alkaline developing agent (70-140 sec.).

EXAMPLES 20 TO 25

The procedure of Example 19 was repeated but using in place of the arsenous sulphide in Example 19, the inorganic photosensitive substances 1 to 5 as given Table 5 respectively. The sensitized plates produced were exposed through a mask on a copying frame and developed for 1 to 2 minutes in the manner described in Example 19 but using developing solutions differing from that used in Example 19 in respect of the basic component thereof as indicated in Table 5. Thus a positive image in the photosensitive layer was obtained. The procedure described in Example 19 was continued until a ready offset plate was produced in each case.

TABLE 5

| No. | Inorganic photosensitive substance | Composition of the alkaline developer |
|---|---|---|
| 1. | $P_2Se_3$ | 16% solution of $(CH_3)_2NH$ |
| 2. | $As_2Se_7$ | 4% solution of $(CH_3)_2NH$ |
| 3. | $As_2Se_3$ | 33% solution of $(CH_3)_2NH$ |
| 4. | $P_{20}Se_{60}Ge_{20}$ | 10% solution of $(CH_3)_2NH$ |
| 5. | $As_2S_3I_{1.2}$ | 2.3 g/l of $Na_2CO_3$ |

EXAMPLE 26

A photosensitive layer was deposited onto an anodized aluminium offset plate by evaporation under a vacuum better than $10^{-5}$ Torr in the following manner:

Employing a condensation rate of 10 A/sec., there were deposited in turn a 0.025 um thick layer of arsenous sulphide followed by a layer of $1 \times 10^{-4}$ g/cm$^2$ of Victoria Blue B (C.I.44045—Basic Blue 26). This process was repeated twice with the same quantities of arsenous sulphide and dye being deposited in each step. A final layer of arsenous sulphide, 0.025 um thick, was then deposited on the third dyestuff coating. The sensitized offset plate thus produced was exposed to a suitable mask and was developed using a cotton pad soaked in a 50 g/l aqueous solution of sodium carbonate. Thus a positive image in the photosensitive layer was obtained. Subsequent working up of the plate was carried out in the manner described in Example 19.

EXAMPLE 27

The following procedure was adopted to deposit onto an anodised aluminium offset plate under a vacuum better than $10^{-5}$ Torr a photosensitive layer:

In turn there was deposited the following—a 0.025 um thick layer of arsenous sulphide, followed by $1 \times 10^{-4}$ g/cm$^2$ of Victoria Blue B (C.I.44045—Basic Blue 26)—followed by a further 0.025 um thick layer of arsenous sulphide to which was then applied a layer of Patent Blue A (C.I. 42052—Acid Blue 5) in an amount of $0.8 \times 10^{-4}$ g/cm$^2$ followed next by a further 0.025 um thick layer of arsenous sulphide and then Cyanosine B deposited in amount of $1.1 \times 10^{-4}$ g/cm$^2$. Finally arsenous sulphide was deposited in a thickness of 0.025 um followed by a surface layer containing equal quantities of the three dyes in a mixture produced by simultaneous evaporation from respective sources thereof, the total amount of the dyes in this final layer being $0.1 \times 10^{-4}$ g/cm².

The sensitized offset plate thus produced was exposed and developed by the procedure of Example 19 using a 50 g/l aqueous solution of sodium carbonate developing agent to obtain a positive image in the photosensitive layer. Subsequent working up was by the procedure described in Example 19.

EXAMPLE 28

A photosensitive layer was vacuum deposited onto an anodised aluminium offset plate under a vacuum better than $10^{-5}$ Torr in the following way:

Arsenous sulphide was evaporated from a crucible so as to be deposited in an amount of 10 A/sec. Simultaneously, diphenyl guanidine was evaporated from another crucible, doping the arsenous sulphide to an extent of 7.0 weight percent. After the first 0.03 um of arsenous sulphide doped with diphenyl guanidine had been deposited, $5 \times 10^{-4}$ g/cm² of the dyes Luxol brilliant green BL and p-ethoxychrysoidine previously mixed in equal quantities and homogenised were evaporated onto the already deposited sensitized layer. When deposition of these dyes was completed, the two deposition stages were repeated in the same order. Finally there was applied to the second mixed dye layer, 0.04 um of arsenous sulphide doped with diphenyl guanidine to the aforementioned extent followed by a deposit of $1 \times 10^{-5}$ g/cm² of p-ethoxychrysoidine evaporated from a fourth source.

The thus sensitized offset plate was exposed and developed in the manner described in Example 19 using a 50 g/l aqueous solution of sodium carbonate. The plate with the positive image in the photosensitive layer already obtained was then worked up in the manner described in Example 19.

EXAMPLE 29

A photosensitive layer was vacuum deposited under a vacuum better than $10^{-5}$ Torr onto an anodised aluminium offset plate in the following way:

Arsenous sulphide was evaporated from a crucible and deposited on the plate at a condensation rate of 10 A/sec. while simultaneously Chrysoidine (C.I.112-70—Basic Orange 2) was evaporated from a second crucible to dope the arsenous sulphide to an extent of 8% by weight.

The thus sensitized offset plate was then exposed and developed in the manner described in Example 19 using a 75 g/l aqueous solution of sodium carbonate. The plate with the positive image in the photosensitive layer already obtained was then worked up in the manner described in Example 19.

EXAMPLE 30

A photographic emulsion prepared in the manner described in Bulgarian Authorship Certificate No. 27331 was applied to a carrier base and exposed in the manner described in Example 1, after which it was developed for 1-2 minutes in the alkaline developing solution used in Example 16. After thorough washing of the developed emulsion in water to achieve complete removal of the dye and drying the resulting product, a ready phase grid was obtained.

We claim:

1. A photographic material for use in photolithography, which material is capable of yielding, on imagewise exposure to radiation, a latent positive image, which material comprises
   (1) a carrier base;
   (2) a thin homogenous or emulsion photosensitive layer consisting essentially of at least one inorganic photosensitive substance selected from sulphides, selenides and tellurides of phosphorus, arsenic, germanium and metals, and an organic compound disposed in or on said photosensitive layer, said organic compound being selected from dyestuffs having the capacity for dyeing tannined cotton, dyestuffs having the capacity for dyeing synthetic fibres, compounds capable of acting as accelerators, antioxidants or age resistors in the vulcanization of elastomers, and developing agents effective in the development of silver halide-based photographic materials; and
   (3) a single elemental metal layer, which layer is in intimate contact with the photosensitive layer and constitutes the said carrier base or is a layer deposited on the said carrier base before formation of the photosensitive layer, the metal being unreactive with the said photosensitive substance in the photosensitive layer when the latter is exposed to radiation;
   and whereby the said photosensitive substance thus disposed in the photosensitive layer has a photoselective capacity such that when treated with an alkaline developer imagewise exposed portions thereof are dissolved to the exclusion of unexposed portions thereof.

2. A photographic material as claimed in claim 1, wherein the dyestuff having the capacity for dyeing tannined cotton is a xanthine, acridine, azine, thiazine, diphenylmethane or triphenylmethane dye, a basic azo dye or a cyanine dye.

3. A photographic material according to claim 1, wherein the dyestuff having the capacity for dyeing synthetic fibres is a dyestuff for dyeing polyacrylonitrile or acrylic fibres selected from basacryl, sandoacryl, remacryl, astrazon, deorlin, maxilon and setacyl dyes.

4. A photographic material according to claim 1, wherein the compound capable of acting as an accelerator, antioxidant or age resistor in the vulcanization of elastomers is selected from dithiocarbamates, thiuramsulphides, thiazoles, sulphonamides, guanidines and aldamines having the general formulae I to VI respectively as follows:

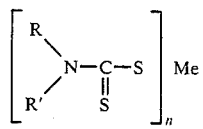

wherein R and R' are hydrocarbyl radicals, Me denotes a metal or amino group and n denotes the valency of the metal or amino group;

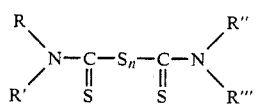

wherein R, R', R" and R'" are hydrocarbyl radicals and n denotes an integer of from 1 to 4;

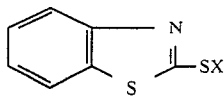  III wherein X denotes hydrogen, a metal atom or an organic radical;

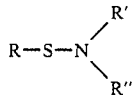  IV wherein R denotes a thiazolyl or benzthiazolyl radical, or a residue of a carbamic acid or a heterocyclic compound, and R and R" denotes hydrocarbyl radicals;

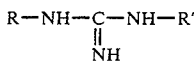  V wherein R and R' denote hydrocarbyl radicals; and

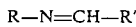  VI wherein R denotes a hydrocarbyl radical and R'—CH= denotes the residue of an aldehyde; and heterocyclic compounds containing a heterocyclic five-membered ring and sulphonated and sulphydryl derivatives thereof.

5. A photographic material as claimed in claim 1, wherein the developing agent effective in the development of silver halide-based photographic materials is selected from methol, hydroquinone, pyrocatechol, para-aminophenol and para-phenylenedaimine.

6. A photographic material according to claim 1, wherein the carrier base or a said metal layer is formed of an acid etchable metal on which the photosensitive layer has been deposited.

7. A photographic material as claimed in claim 6, wherein said etchable metal is chromium or aluminium which is anodised.

8. A photographic material as claimed in claim 1, wherein the organic compound is present in the photosensitive layer as a compound or compounds doping the photosensitive layer in an overall concentration of 0.1 to 20% by weight through part or all of its thickness and/or constitute(s) one or more intermediate discrete films at different depths within the photosensitive layer and/or is deposited on the surface of the photosensitive layer in an amount varying from a mono-atomic film up to an amount of $10^{-2}$ g/cm$^2$.

9. A photographic material according to claim 8, which is an unexposed photographic material in which the organic compound has been incorporated in the photosensitive layer and/or applied to its surface during the preparation of the layer.

10. A photographic material as claimed in claim 9, wherein the organic compound has been introduced into the photosensitive layer by simultaneous evaporation of the organic compound and the photosensitive substance and deposition together on the carrier base and/or said organic compound is deposited as one or more discrete intermediate layers at one or more depths in the photosensitive layer by evaporation and deposition and/or said organic compound is vacuum deposited on the surface of the photosensitive layer.

11. A photographic material as claimed in claim 10, wherein the photosensitive layer is vacuum deposited on the carrier base in a thickness of 0.01 to 10 um.

12. A photographic material according to claim 8, wherein the photosensitive substance is applied to the carrier base as a solution or suspension containing one or more said organic compounds which have subsequently been dried.

13. A photographic material as claimed in claim 8, wherein the organic compound is coated on the surface of the photosensitive layer and/or is present in one or more intermediate films produced by immersion of the carrier base in a solution of the organic compound or by depositing a said solution on the carrier base by centrifugation, powder coating, spreading or coating thereof.

14. An imagewise exposed photographic material for use in photolithography, which carries a latent positive image and which material comprises
(1) a carrier base;
(2) a thin homogenous or emulsion photosensitive layer consisting essentially of at least one inorganic photosensitive substance selected from sulphides, selenides and tellurides of phosphorus, arsenic, germanium and metals and an organic compound disposed in or on said photosensitive layer after exposure thereof, and said organic compound being selected from dyestuffs having the capacity for dyeing tannined cotton, dyestuffs having the capacity for dyeing synthetic fibres, compounds capable of acting as accelerators, antioxidants or age resistors in the vulcanization of elastomers, and developing agents effective in the development of silver halide-based photographic materials; and
(3) a single elemental metal layer, which layer is in intimate contact with the photosensitive layer and constitutes the said carrier base or is a layer deposited on the said carrier base before formation of the photosensitive layer, the metal being unreactive with the said photosensitive substance in the photosensitive layer when the latter is exposed to radiation;
and whereby the said photosensitive substance thus disposed in the photosensitive layer has a photoselective capacity such that when treated with an alkaline developer imagewise exposed portions thereof are dissolved to the exclusion of unexposed portions thereof.

15. A photographic material as claimed in claim 14, wherein the carrier base or a said metal layer on which the photosensitive layer has been deposited is formed of an acid etchable metal.

16. A photographic material as claimed in claim 15, wherein said etchable metal is chromium or aluminium which is anodised.

17. A photographic material as claimed in claim 14, wherein the dyestuff having the capacity for dyeing tannined cotton is a xanthine, acridine, azine, thiazine, diphenylmethane or triphenymethane dye, a basic azo dye or a cyanine dye.

18. A photographic material according to claim 14, wherein the dyestuff having the capacity for dyeing synthetic fibres is a dyestuff for dyeing polyacrylonitrile or acrylic fibres selected from basacryl, sandoacryl, remacryl, astrazon, deorlin, maxilon and setacyl dyes.

* * * * *